United States Patent
Dittmer

(10) Patent No.: US 8,102,643 B2
(45) Date of Patent: Jan. 24, 2012

(54) COOLING SYSTEM FOR HIGH VOLTAGE SYSTEMS

(75) Inventor: Larry J. Dittmer, Basco, IL (US)

(73) Assignee: Harris Corporation, Melbourne, FL (US)

( * ) Notice: Subject to any disclaimer, the term of this patent is extended or adjusted under 35 U.S.C. 154(b) by 599 days.

(21) Appl. No.: 12/074,282

(22) Filed: Mar. 3, 2008

(65) Prior Publication Data

US 2009/0219693 A1 Sep. 3, 2009

(51) Int. Cl.
*H05K 7/20* (2006.01)
(52) U.S. Cl. .... 361/677; 361/699; 361/701; 165/104.33
(58) Field of Classification Search .................. 361/699, 361/701, 676–677; 165/80.4, 104.33
See application file for complete search history.

(56) References Cited

U.S. PATENT DOCUMENTS

| | | | |
|---|---|---|---|
| 1,943,268 A * | 1/1934 | Fleischer | 252/70 |
| 3,536,622 A * | 10/1970 | Knecht, Jr. et al. | 508/532 |
| 3,834,456 A * | 9/1974 | Clarke et al. | 165/104.17 |
| 4,589,898 A * | 5/1986 | Beaver | 65/503 |
| 4,664,181 A * | 5/1987 | Sumberg | 165/104.13 |
| 5,571,420 A * | 11/1996 | Creeron et al. | 210/665 |
| 5,804,063 A * | 9/1998 | Creeron et al. | 210/167.01 |
| 5,901,037 A | 5/1999 | Hamilton et al. | |
| 6,601,641 B1 | 8/2003 | Stefanik et al. | |
| 6,684,940 B1 * | 2/2004 | Chao et al. | 165/104.21 |
| 7,107,783 B2 * | 9/2006 | Smolko et al. | 62/315 |
| 7,141,105 B2 * | 11/2006 | Udagawa et al. | 106/31.49 |
| 7,297,484 B2 * | 11/2007 | Wittwer et al. | 435/6.1 |
| 7,487,643 B2 * | 2/2009 | Chen et al. | 165/104.21 |
| 2006/0145120 A1 * | 7/2006 | Egawa et al. | 252/73 |
| 2007/0023730 A1 * | 2/2007 | Paonessa et al. | 252/68 |
| 2008/0166615 A1 * | 7/2008 | Egawa et al. | 429/26 |
| 2010/0254088 A1 * | 10/2010 | Ishida et al. | 361/700 |

OTHER PUBLICATIONS

"Chevrolet Repair Manual, 1935 Master De Luxe, Standard and Truck Models, Series EA, EB, EC, ED and Q", 2nd Ed., Chevrolet Motor Co., 1935, p. 131, printed from www.Old-Carburetors.com on Feb. 3, 2011.*
Kasymbekov et al., "Separation of substances by fractional crystallization from outflowing liquid films", Theoretical Foundations of Chemical Engineering, vol. 19, No. 1, Sep. 1985, pp. 15-21.*
Zeugin et al., "A study of microlayer evaporation for three binary mixtures during nucleate boiling", Chemical Engineering Science, vol. 30, Jul. 1975, pp. 679-683.*
U.S. Patent Application Publication US2007/0034354A1; published Feb. 15, 2007.

* cited by examiner

*Primary Examiner* — Robert J Hoffberg
(74) *Attorney, Agent, or Firm* — Tarolli, Sundheim, Covell & Tummino LLP

(57) ABSTRACT

A cooling system for a high voltage system can include a high voltage supply and an electrical component coupled to the high voltage supply. The electrical component can generate heat that needs to be dissipated. The cooling system can include a cooling mechanism for dissipating the heat. The cooling mechanism can include a liquid conduit thermally coupled to the electrical component. The liquid conduit can contain a cooling solution comprising an alcohol having the formula R—OH, wherein R is a hydrocarbon having the formula $C_nH_{2n+1}$ and n is any positive integer between 1 and 6. The cooling system can additionally include a pump and a heat exchanger, each of which may be coupled to the liquid conduit.

16 Claims, 5 Drawing Sheets

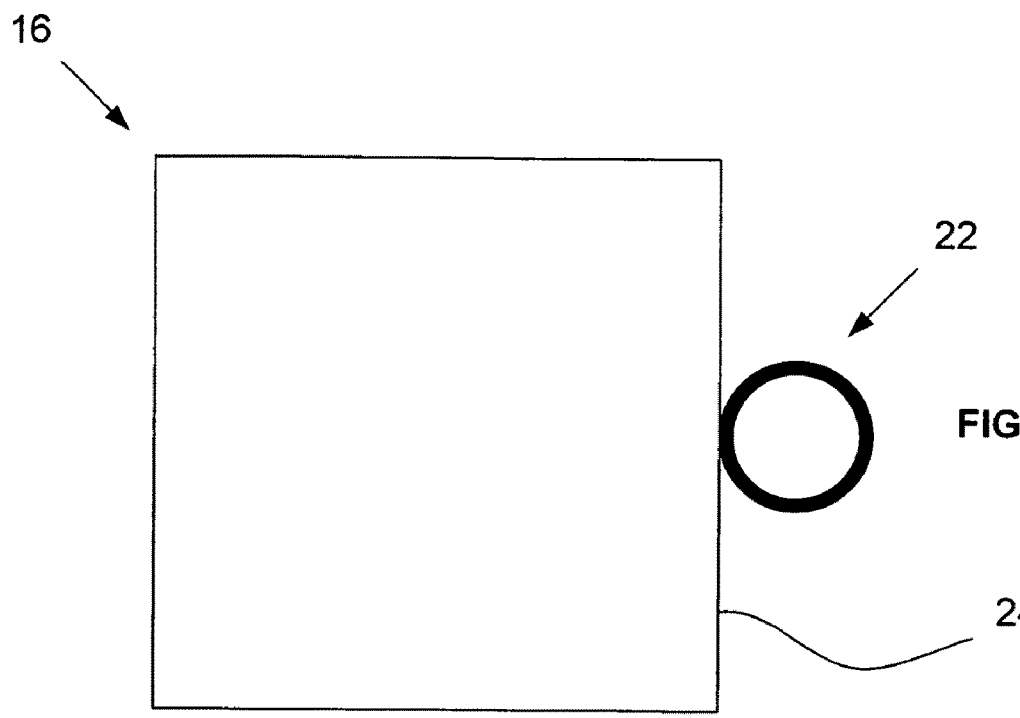
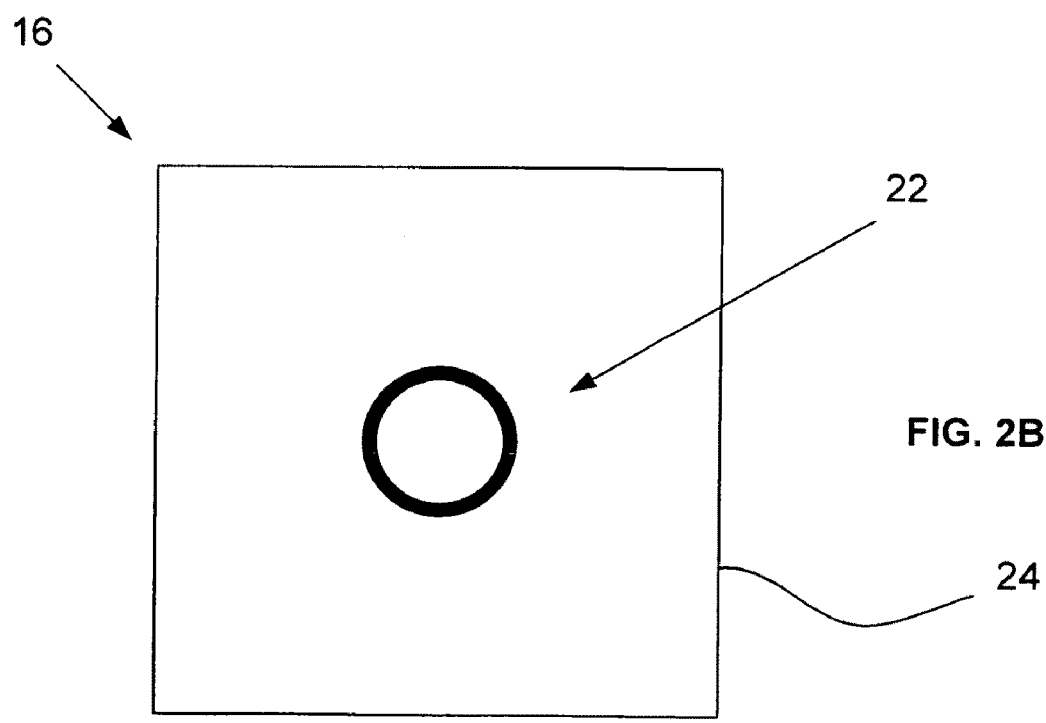

COOLING SYSTEM FOR HIGH VOLTAGE SYSTEMS

TECHNICAL FIELD

The present invention relates generally to compositions and methods for cooling electrical systems, and more particularly to a cooling system for dissipating heat generated by high voltage systems and for minimizing microbial growth in such cooling systems.

BACKGROUND OF THE INVENTION

High voltage power systems, such as inductive output tubes (IOTs) and high voltage transformers, require effective heat dissipation to operate effectively. In many contemporary applications, an air-cooled heat dissipation system is used for transmitting heat away from various components of such systems. For example, an IOT system may use the flow of ambient air to dissipate the radiant thermal energy generated by the IOT. Air-cooled systems have a limited ability to cool IOT collectors, however, because of the limited heat capacity of gases. Furthermore, air flow has varying pressure and velocity, which can lead to unequal cooling of IOTs. Unequal cooling can then lead to the formation of hot spots, which may degrade the IOT collector(s) and result in failure of the IOT's vacuum integrity.

Another approach to cooling IOT systems includes the use of water-based fluids to remove thermal energy from the IOT. The use of water-based fluids as a cooling media requires careful engineering to prevent the water-based fluids from damaging electronic circuitry and the occurrence of electrolysis. In particular, water-based fluids must be continually purified to remove contaminants that may contribute to electrolysis and damage to electrical circuitry. Organic moieties may be added to water-based fluids to mitigate such damage; however, such organic solutions suffer from poor heat transfer capability and pyrolysis at high temperatures. Water-cooled systems also require periodic maintenance to maintain correct operation as water is a medium for the growth of living organisms, which can coat electrical components and interfere with efficient heat transfer.

SUMMARY OF THE INVENTION

The present invention relates generally to compositions and methods for cooling electrical systems, and more particularly to a cooling system for dissipating heat generated by high voltage systems and for minimizing microbial growth in such cooling systems. According to one aspect of the present invention, a cooling system for a high voltage system can include a high voltage supply and an electrical component coupled to the high voltage supply. The electrical component can generate heat that needs to be dissipated. The cooling system can include a cooling mechanism for dissipating the heat. The cooling mechanism can comprise a liquid conduit thermally coupled to the electrical component. The liquid conduit can contain a cooling solution comprising an alcohol having the formula R—OH, wherein R is a hydrocarbon having the formula $C_nH_{2n+1}$ and n is any positive integer between 1 and 6. The cooling system can additionally include a pump and a heat exchanger, each of which may be coupled to the liquid conduit.

BRIEF DESCRIPTION OF THE DRAWINGS

The foregoing and other features of the present invention will become apparent to those skilled in the art to which the present invention relates upon reading the following description with reference to the accompanying drawings, in which:

FIG. 2A is a cross-sectional view taken along Line 2-2 in FIG. 1 showing a liquid conduit of the cooling system thermally coupled to an electrical component of the high voltage system;

FIG. 2B is cross-sectional view showing an alternative embodiment of the liquid conduit and the electrical component in FIG. 2A;

DETAILED DESCRIPTION

Figure 1:
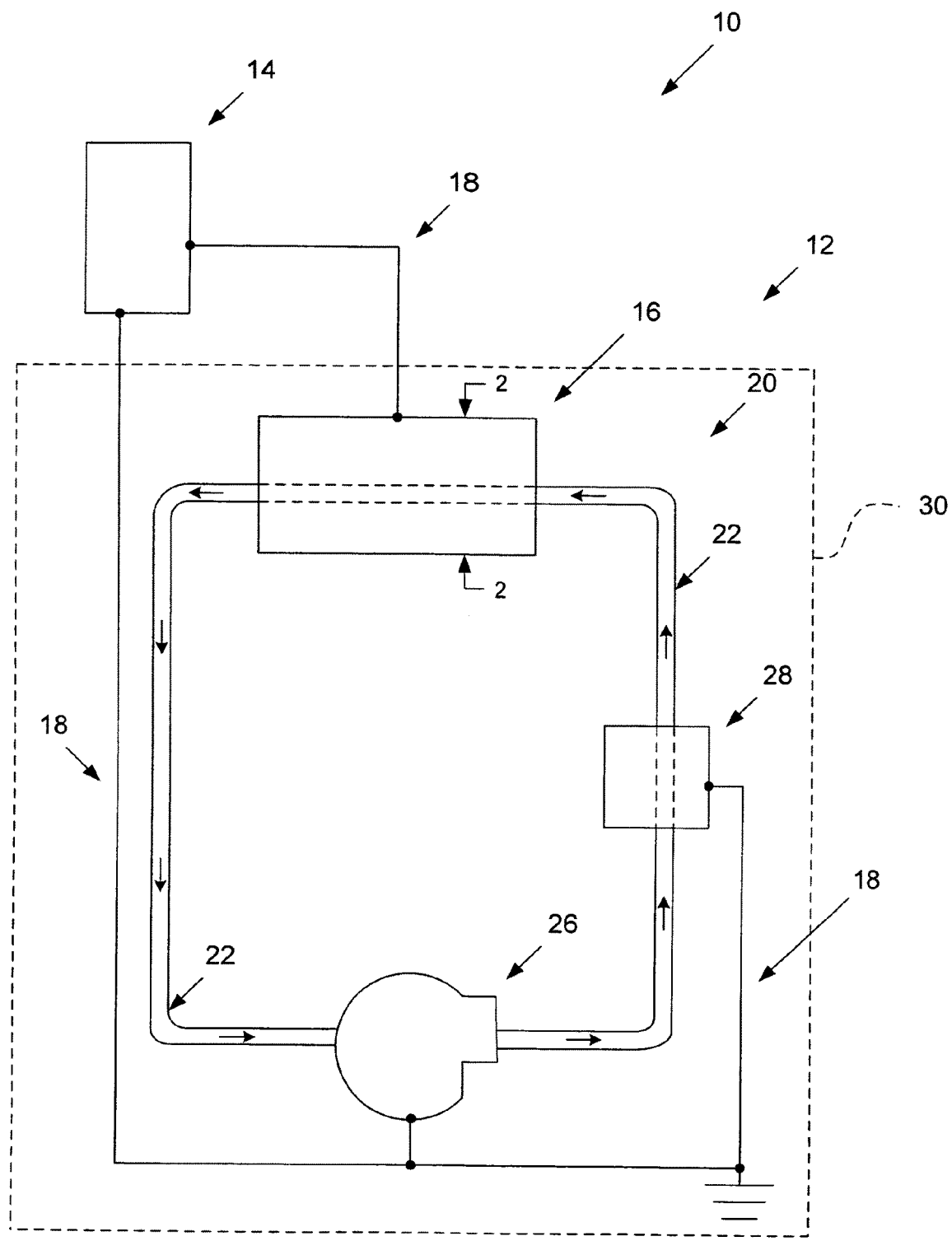
FIG. 1 is a schematic illustration showing a cooling system for a high voltage system constructed in accordance with one aspect of the present invention.
Figure 3A:
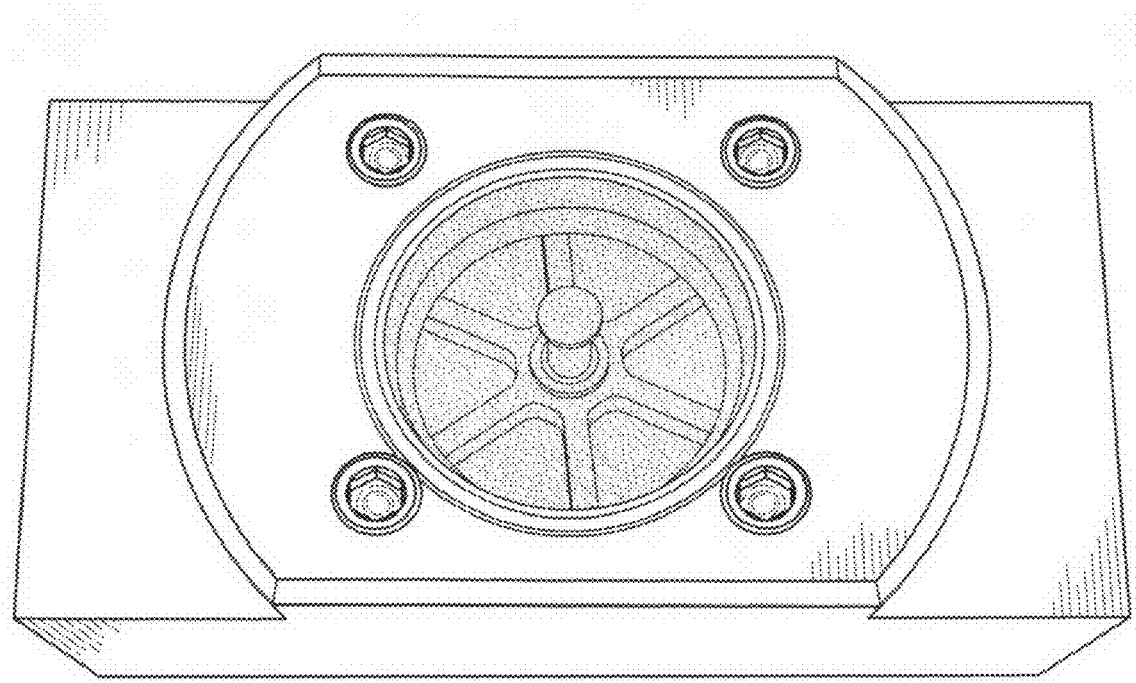
FIG. 3A is a photograph showing a flow counter prior to use with the cooling solution of the present invention (bacterial growth indicated by dark regions)
Figure 3B:
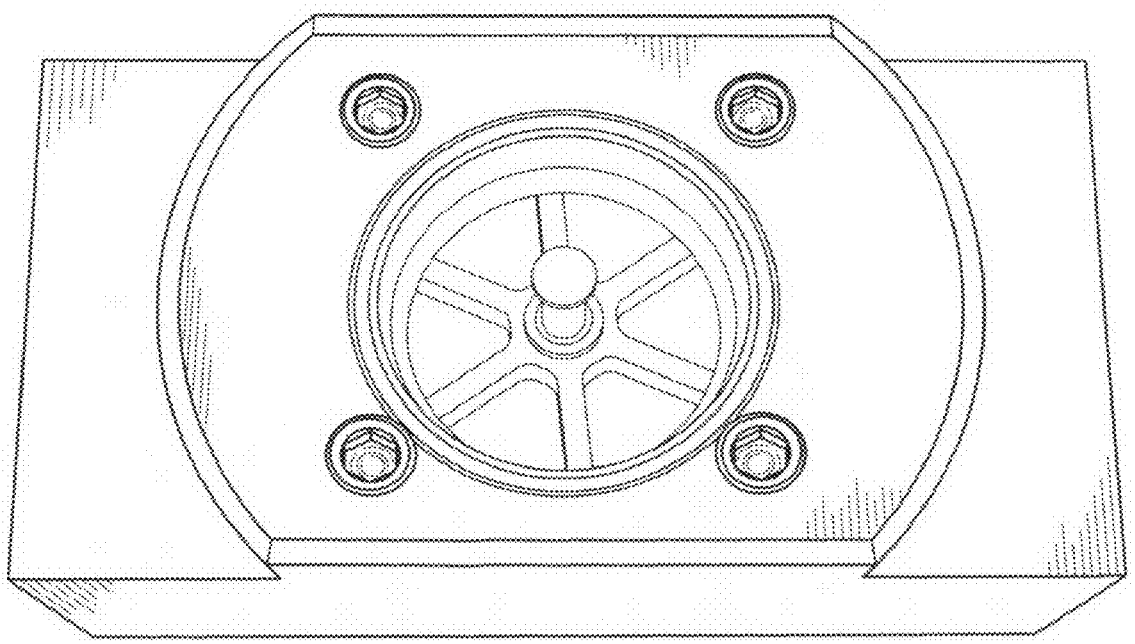
FIG. 3B is a photograph showing the flow counter in FIG. 3A after use with the cooling solution.
Figure 4A:
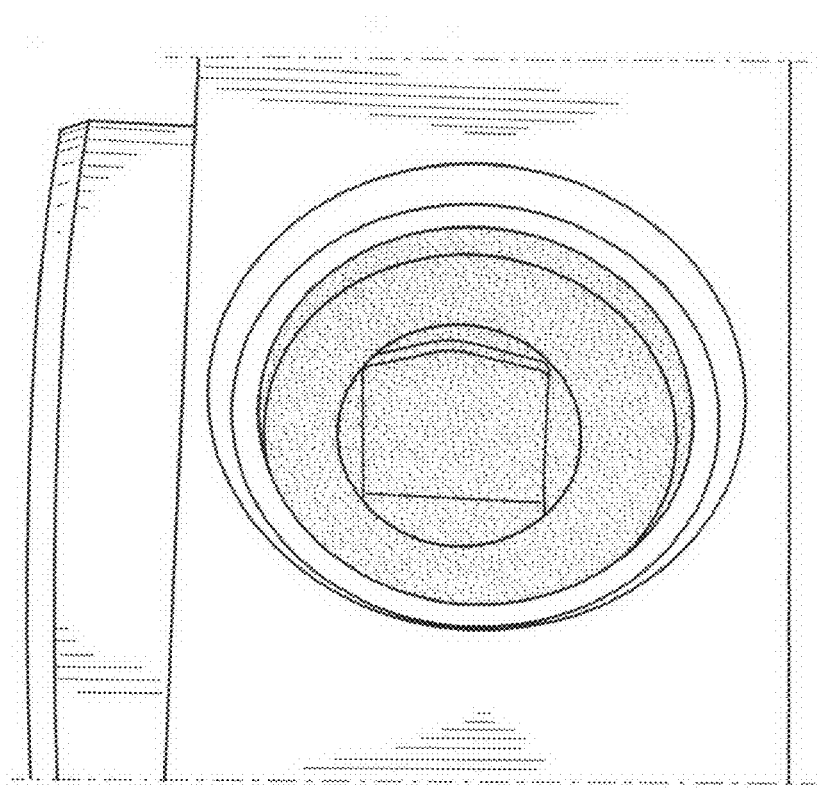
FIG. 4A is a photograph showing an impeller of the flow counter in FIG. 3A.
Figure 4B:
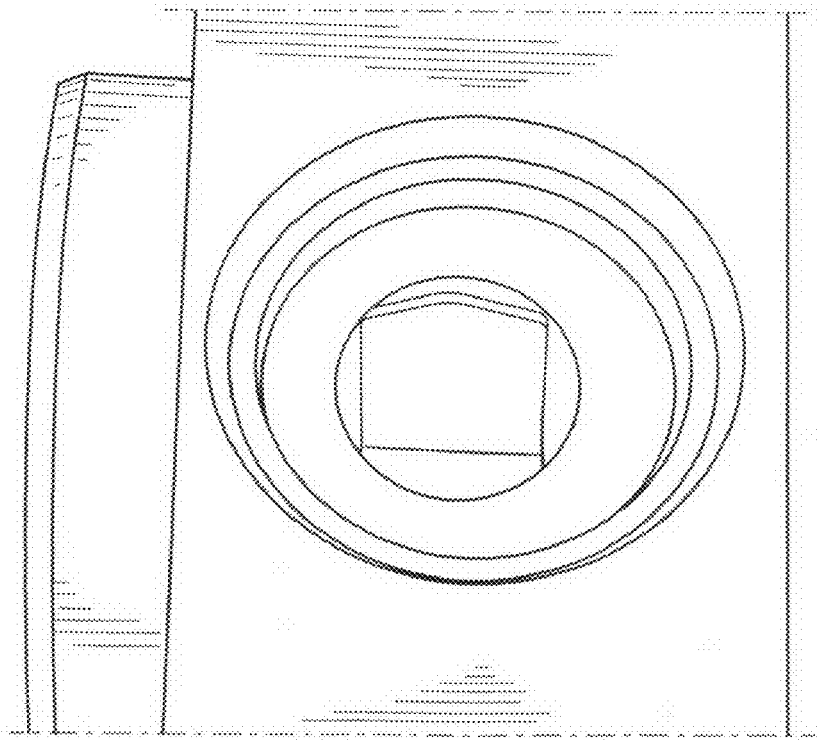
FIG. 4B is a photograph showing an impeller of the flow counter in FIG. 3B after use with the cooling solution.

The present invention relates generally to compositions and methods for cooling electrical systems, and more particularly to a cooling system for dissipating heat generated by high voltage systems and for minimizing microbial growth in such cooling systems. As representative of the present invention, FIG. 1 illustrates a cooling system for dissipating heat generated by an electrical component (or components) of a high voltage system. The present invention is based on the discovery that a cooling solution comprised of a low molecular weight alcohol, such as butanol, is effective for cooling electrical components of a high voltage system while also minimizing the growth of microorganisms within the cooling system. Based on this discovery, the present invention provides a cooling system for dissipating heat generated by an electrical component (or components) of a high voltage system.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

In the context of the present invention, the term "coupled" is defined as directly or indirectly connected in an electrical or non-electrical manner.

As used herein, the term "thermally coupled" refers to a relationship of identified components of the present invention such that thermal energy can be transferred from one element to another component. Thermally coupled components typically involve direct physical contact, although any configuration which allows conduction, convection, and/or radiation transfer of useful quantities of heat can be used.

Referring again to FIG. 1, a cooling system 10 for a high voltage system 12 can comprise a high voltage supply 14 coupled to an electrical component 16. The high voltage supply 14 can be electrically coupled to the electrical component 16 via a direct electrical connection using, for example, at least one electrically insulated wire 18. The high voltage supply 14 can include any electrical device known in the art that is capable of generating a high voltage. Examples of electrical devices that can be used as the high voltage supply 14 can include commercially available devices from NWL Transformers, Inc. (Bordentown, N.J.) or Stein Industries, Inc. (London, ON).

The high voltage system 12 can include at least one electrical component 16 that generates heat which needs to be dissipated. Thus, the electrical component 16 can include any electrical device or apparatus that conveys, stores, and/or utilizes electrical power. One example of an electrical component 16 that may be included as part of the high voltage system 12 is a linear beam device or IOT. The use of IOTs as power amplifiers in television transmitters, and especially in common amplification configurations, for example, are well known in the art. It will be appreciated that an IOT can also include a multistage depressed collector (MSDC) to improve the performance of the IOT. Examples of IOTs and IOTs with one or more depressed collectors are described in U.S. Pat. No. 6,601,641, the entirety of which is hereby incorporated by reference. Other types of electrical components 16 which generate heat that needs to be dissipated are known in the art and can include, for example, high voltage transformers.

The cooling system 10 can include a cooling mechanism 20 for dissipating the heat generated by the electrical component 16. As shown in FIG. 1, the cooling mechanism 20 can comprise at least one liquid conduit 22 for transporting a cooling solution therethrough. The liquid conduit 22 can comprise an electrically-insulated pipe, hose, tube, or any other structure capable of conveying a liquid. The liquid conduit 22 can comprise a single continuous pipe or hose, or, alternatively, a series of fluidly connected pipes or hoses. The liquid conduit 22 can be comprised of a metal (e.g., stainless steel), a hardened plastic (e.g., polyvinyl chloride), a combination thereof, or any other appropriate material known in the art.

The liquid conduit 22 can be thermally coupled to the electrical component 16 such that thermal energy can be effectively conveyed from the electrical component to the cooling solution. As shown in FIG. 2A, for example, the liquid conduit 22 can be in direct contact with an outer surface 24 of the electrical component 16. Alternatively, the liquid conduit 22 can extend directly through a portion of the electrical component 16 (FIG. 2B). It will be appreciated that the liquid conduit 22 can be thermally coupled to any other component(s) of the high voltage system 12.

The cooling solution can comprise an alcohol and at least one other liquid, such as water. The alcohol can have the formula R—OH, wherein R can be a hydrocarbon having the formula $C_nH_{2n+1}$ and n can be any positive integer between 1 and 6. The alcohol can comprise from about 0.1% to about 10% by volume of the cooling solution. In one example of the present invention, the alcohol can comprise butanol. Where the alcohol comprises butanol, the cooling solution can include from about 0.1% to about 7% by volume of butanol and, more particularly, about 0.5% by volume of butanol. The cooling solution can have a dielectric strength of at least about 2 KV, and a resistivity of about 5 MegOhms to about 25 MegOhms.

The cooling solution can be circulated through the liquid conduit 22 (indicated by arrows) by a pump 26 (described below). Use of the cooling solution to dissipate heat generated by the electrical component 16 presents several advantages over conventional cooling solutions also used to dissipate heat. For example, the use of a cooling solution comprised of butanol does not result in an unacceptable increase in the resistivity of the cooling solution. Additionally, the low concentration of butanol that may be used to form the cooling solution prevents significant pyrolysis by high temperature electrical components 16. Further, the use of purification ion exchange equipment (which removes salts from the cooling solution) does not remove enough butanol to prevent or reduce the effectiveness of the cooling solution.

Yet another advantage of the cooling solution is the ability of the solution to minimize microbial growth. As shown in FIGS. 3A-B and FIGS. 4A-B, for example, the use of a 0.5% butanol cooling solution can minimize microbial growth on various components of the cooling system 10. The use of an alcohol, and in particular butanol to form the cooling solution is especially useful for cooling systems 10 that include plastic components as the molecular structure of butanol facilitates its attraction to the surface(s) of the plastic components, which are most attractive to colonies of microorganisms. Accordingly, the cooling solution can also function as an anti-microbial agent to minimize the growth of microorganisms, such as bacteria and fungi, within the cooling system 10.

As noted above, the cooling system 10 can additionally include a pump 26 for circulating the cooling solution through the liquid conduit 22. The pump 26 can be coupled to the liquid conduit 22, and can generally comprise any type of centrifugal pump. The pump 26 can be made of metal, such as stainless steel, plastic, or a combination thereof. Examples of centrifugal pumps that can be used as part of the cooling system 10 are known in the art and can include, for example, a Grundfos CRI series pump (Grundfos Pumps Corp., Fresno, Calif.).

The cooling system 10 can additionally include a heat exchanger 28 for dissipating additional heat from the high voltage system 12. The heat exchanger 28 can be coupled to the liquid conduit 22. For example, the liquid conduit 22 can be in direct contact with an outer surface (not shown in detail) of the heat exchanger 28 or, alternatively, the liquid conduit can extend directly through a portion of the heat exchanger. The heat exchanger 28 can comprise any one or combination of liquid or air-cooled heat sinks known in the art. For example, the heat exchanger 28 can include any one or combination of heat sinks which are commercially available from Bell & Gossett, Inc. (Morton Grove, Ill.).

The present invention can additionally include a housing 30 for enclosing a portion of the cooling system 10 and/or the high voltage system 12. The housing 30 can include any suitable structure, such as a cabinet, that is capable of holding at least a portion of the cooling system 10 and/or the high voltage system 12. For example, the housing 30 can include an electrically insulated or non-insulated cabinet made of metal, plastic, or a combination thereof. In one example of the present invention, the housing 30 can enclose the electrical component 16, the cooling mechanism 20, the pump 26, and the heat exchanger 28. In this configuration, the high voltage supply 14 can be located outside of the housing 30 while remaining coupled to the other components of the high voltage system 12 via an electrically-insulated wire (or wires), for example.

Figure 5:
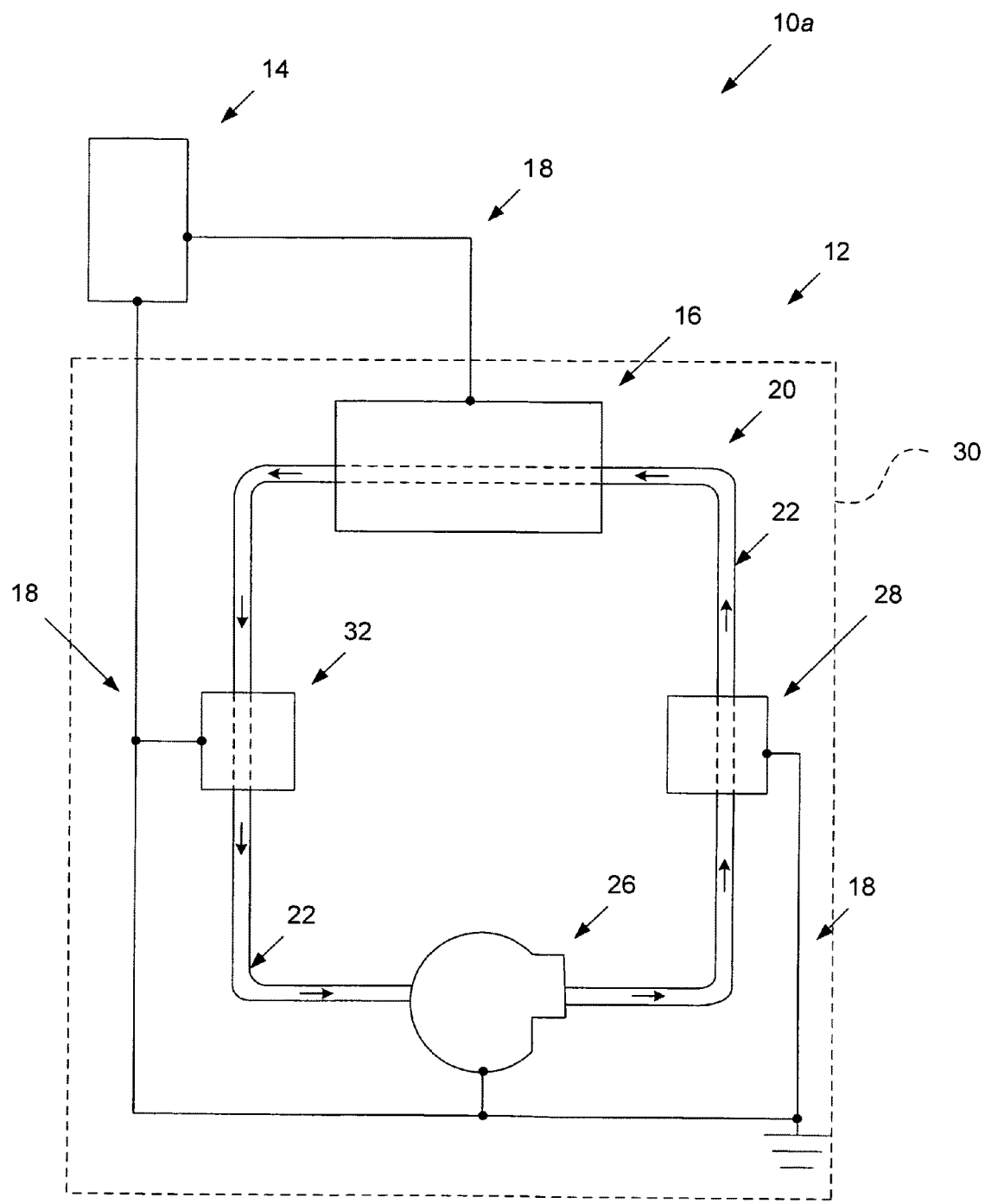
FIG. 5 is a schematic illustration showing an alternative embodiment of the cooling system in FIG. 1.

Another embodiment of the present invention is illustrated in FIG. 5. The cooling system $10_a$ shown in FIG. 5 is identically constructed as the cooling system 10 shown in FIG. 1, except as described below. In FIG. 5, structures that are identical as structures in FIG. 1 use the same reference numbers, whereas structures that are similar but not identical carry the suffix "a".

As shown in FIG. 5, the high voltage system 12 can comprise a high voltage supply 14 coupled to an electrical component 16 that generates heat which needs to be dissipated. The cooling system $10_a$ can include a cooling mechanism 20 for dissipating heat from the electrical component 16. The cooling mechanism 20 can comprise a liquid conduit 22 through which a cooling solution can be circulated. The cooling solution can comprise an alcohol and at least one other liquid, such as water. The alcohol can have the formula R—OH, wherein R can be a hydrocarbon having the formula $C_nH_{2n+1}$ and n can be any positive integer between 1 and 6. The alcohol can comprise from about 0.1% to about 10% by volume of the cooling solution. The cooling system $10_a$ can additionally include a pump 26 and a heat exchanger 28, each of which may be coupled to the liquid conduit 22.

As shown in FIG. 5, the cooling system $10_a$ can also include a purification component 32 for purifying the cooling solution. The purification component 32 can be coupled to the liquid conduit 22, and can include any one or combination of known water purification systems. For example, the purification component 32 can include an ion exchange water purification system. Ion-exchange systems percolate water through bead-like spherical resin materials (ion-exchange resins), and ions in the water are then exchanged for other ions fixed to the beads. Examples of ion exchange systems are known in the art and can include ion exchange systems that are commercially available from Barnstead International (Dubuque, Iowa). It will be appreciated that other types of water purification systems, such as distillation systems, carbon adsorption systems, reverse osmosis systems, UV systems, deionization systems, and ultra filtration systems may additionally or alternatively be included as part of the purification component 32.

The following example is for the purpose of illustration only and is not intended to limit the scope of the claims, which are appended hereto.

Example

Table 1 illustrates the results of a chemical sterilization test performed in accordance with one aspect of the present invention.

TABLE 1

Chemical Sterilization Test for PowerCD High Voltage System

| Time Point | Resistivity (MegOhms) |
| --- | --- |
| 11:26 | 10.9 |
| Addition of 0.5% butanol cooling solution | |
| 11:31 | 8.8 |
| 11:36 | 7.1 |
| 11:40 | 6.5 |
| 11:51 | 5.8 |
| 11:58 | 5.7 |
| 12:05 | 5.8 |
| 12:16 | 6.0 |
| 12:19 | 6.2 |
| 12:42 | 7.0 |
| 13:07 | 8.2 |
| 14:06 | 8.5 |

For the test, a high voltage system comprising of a single high power amplifier using a e2v energy saving collector IOT (ESCIOT) tube was used. Five different collectors were used as part of the system. The voltage on the collectors was over the range of 0 to 34.5 KV on collectors 1 through 5. Each collector was cooled by the same cooling solution. The electron gun was at −34.5 KV and was air-cooled by separate systems.

A baseline measurement of resistivity was made prior to addition of butanol. Seven fluid ounces of butanol were then infused into a cooling mechanism of the high voltage system. This resulted in a concentration of 0.5% butanol in the 11 gallon cooling mechanism. The flow rate of the cooling solution was 15.6 gpm. The collector currents were unchanged. The total collector dissipation energy transferred to the cooling solution was approximately 25 KW. Resistivity measurements were then taken at different intervals (Table 1).

As can be seen in Table 1, the resistivity of the cooling solution during delivery of energy to the IOT was maintained between 5 MegOhms and 9 MegOhms. These results show that a cooling solution comprised of 0.5% butanol does not result in an unacceptable increase in the conductivity of cooling solution, and that the heat transfer capacity of the solution is nearly as good as that of pure water. Additionally, the cooling solution controlled the growth of bacteria on the pump component of the high voltage system (FIGS. 3A-B and FIGS. 4A-B).

From the above description of the invention, those skilled in the art will perceive improvements, changes and modifications. For example, it will be appreciated that the cooling system 10 and/or the high voltage system 12 can include other mechanical or electrical components, such as flow meters (not shown), thermometers (not shown), conductivity meters (not shown), and valves (not shown). Such improvements, changes, and modifications are within the skill of the art and are intended to be covered by the appended claims.

Having described the invention, I claim:

1. A cooling system for a high voltage system, the high voltage system including a high voltage supply and an electrical component coupled to the high voltage supply, the electrical component generating heat that needs to be dissipated, said cooling system comprising:
    a closed-system cooling mechanism for dissipating the heat, said closed-system cooling mechanism comprising a liquid conduit thermally coupled to said electrical component, said liquid conduit containing an anti-microbial liquid cooling solution consisting essentially of water and 0.1% to 7% by volume of an alcohol having the formula R—OH; wherein R is a hydrocarbon having the formula $C_nH_{2n+1}$ and n is any positive integer between 3 and 5;
    a pump coupled to said liquid conduit; and
    a heat exchanger coupled to said liquid conduit.

2. The cooling system of claim 1, wherein the electrical component is an inductive output tube (TOT).

3. The cooling system of claim 1, wherein the electrical component is a high power, high voltage transformer.

4. The cooling system of claim 1 further including a housing that encloses at least part of the high voltage system.

5. The cooling system of claim 1, wherein the alcohol comprises butanol.

6. The cooling system of claim 5, wherein said anti-microbial cooling solution consisting essentially of said water and 0.5% by volume of said butanol.

7. The cooling system of claim 1 further comprising a purification component coupled to said liquid conduit.

8. A high voltage system comprising:
    a high voltage supply;
    an electrical component coupled to said high voltage supply, said electrical component generating heat that needs to be dissipated;

a closed-system cooling mechanism for dissipating the heat, said closed-system cooling mechanism comprising a liquid conduit thermally coupled to said electrical component, said liquid conduit containing an anti-microbial liquid cooling solution consisting essentially of water and 0.1% to 7% by volume of an alcohol having the formula R—OH; wherein R is a hydrocarbon having the formula $C_nH_{2n+1}$ and n is any positive integer between 3 and 5;

a pump coupled to said liquid conduit; and a heat exchanger coupled to said liquid conduit.

9. The high voltage system of claim 8 further comprising a purification component coupled to said liquid conduit.

10. The high voltage system of claim 8, wherein said electrical component is an IOT.

11. The high voltage system of claim 8, wherein said electrical component is a high power, high voltage transformer.

12. The high voltage system of claim 8 further including a housing that encloses at least part of said high voltage system.

13. The high voltage system of claim 8, wherein the alcohol comprises butanol.

14. The high voltage system of claim 13, wherein said anti-microbial liquid cooling solution consisting essentially of said water and 0.5% by volume of said butanol.

15. A cooling system for a high voltage system, the high voltage system including a high voltage supply and an electrical component coupled to the high voltage supply, the electrical component generating heat that needs to be dissipated, said cooling system comprising:

a closed-system cooling mechanism for dissipating the heat, said closed-system cooling mechanism comprising a liquid conduit thermally coupled to said electrical component, said liquid conduit containing an aqueous anti-microbial liquid cooling solution consisting essentially of water and 0.1% to 7% by volume of butanol;

a pump coupled to said liquid conduit; and a heat exchanger coupled to said liquid conduit.

16. The cooling system of claim 15, said aqueous anti-microbial liquid cooling solution consisting essentially of said water and 0.5% by volume of said butanol.

* * * * *